United States Patent [19]
Clouser et al.

[11] Patent Number: 6,132,887
[45] Date of Patent: *Oct. 17, 2000

[54] HIGH FATIGUE DUCTILITY ELECTRODEPOSITED COPPER FOIL

[75] Inventors: Sidney J. Clouser, Chardon, Ohio; Rudolf Wiechmann, Freiberg, Germany; Bernd Schneider, March, Germany; Ulrike Bohmler, Emmendingen, Germany; R. Duane Apperson, McConnelsville, Ohio

[73] Assignee: Gould Electronics Inc., Eastlake, Ohio

[ * ] Notice: This patent issued on a continued prosecution application filed under 37 CFR 1.53(d), and is subject to the twenty year patent term provisions of 35 U.S.C. 154(a)(2).

[21] Appl. No.: 08/647,706

[22] Filed: May 24, 1996

Related U.S. Application Data

[60] Provisional application No. 60/000,277, Jun. 16, 1995.

[51] Int. Cl.⁷ .................................................. C25D 1/04
[52] U.S. Cl. ........................ 428/606; 428/607; 428/674; 428/544; 205/50; 205/291
[58] Field of Search ................................. 428/472, 469, 428/606, 607, 674, 675, 676; 205/50, 76, 77, 291

[56] References Cited

U.S. PATENT DOCUMENTS

| | | | |
|---|---|---|---|
| 4,568,431 | 2/1986 | Polan et al. | 204/13 |
| 4,692,221 | 9/1987 | Parthasarathi | 204/13 |
| 4,789,438 | 12/1988 | Polan | 204/13 |
| 4,956,053 | 9/1990 | Polan et al. | 204/13 |
| 5,071,520 | 12/1991 | Lin et al. | 205/155 |
| 5,171,417 | 12/1992 | DiFranco et al. | 205/77 |
| 5,181,770 | 1/1993 | Brock et al. | 205/77 |
| 5,356,528 | 10/1994 | Fukuda et al. | 205/155 |
| 5,403,465 | 4/1995 | Apperson et al. | 205/77 |
| 5,421,985 | 6/1995 | Clouser et al. | 205/77 |
| 5,431,803 | 7/1995 | DiFranco et al. | 205/50 |
| 5,830,583 | 11/1998 | Clouser et al. | 428/606 |

OTHER PUBLICATIONS

PCT/US96/07918, PCT International Search Report mailed Mar. 10, 1997.

"A New Ductility and Flexural Fatigue Test Method for Copper Foil and Flexible Printed Wiring" by W. Engelmaier, 21st Proceedings of the Annual IPC Meeting, Washington, D.C. (Apr. 1978).

"Copper Foil for Flexible Circuits", D. Avery, *Circuit World*, 14(2) 16 (1988).

"Results of the IPC Copper Foil Ductility Round–Robin Study", W. Engelmaier, *Testing of Metallic and Inorganic Coatings*, 66 (1987).

*Primary Examiner*—Terrell Morris
*Assistant Examiner*—Clyde Juska
*Attorney, Agent, or Firm*—Renner, Otto, Boisselle & Sklar LLP

[57] ABSTRACT

This invention relates to an annealable electrodeposited copper foil having a substantially uniform unoriented grain structure that is essentially columnar grain free, said foil being characterized by a fatigue ductility of at least about 25% after being annealed at 177° C. for 15 minutes. In one embodiment, the foil is annealed, said foil being characterized by a fatigue ductility of at least about 65%. The invention also relates to a process for making an electrodeposited copper foil using an electrolyte solution characterized by a critical concentration of chloride ions of up to about 5 ppm and organic additives of up to about 0.2 ppm.

25 Claims, 2 Drawing Sheets

HIGH FATIGUE DUCTILITY ELECTRODEPOSITED COPPER FOIL

This application is a continuation-in-part of U.S. Provisional Application Ser. No. 60/000,277, filed Jun. 16, 1995, the disclosure of said application being incorporated herein by reference in its entirety.

FIELD OF THE INVENTION

This invention relates to high fatigue ductility electrodeposited copper foils, and a method of making such foils.

BACKGROUND OF THE INVENTION

Flexible printed circuit boards are used in electronic devices where the circuit is bent one time during installation, such as in the dashboard of an automobile, and/or where the circuit is flexed many times, such as in a camera, and/or where the circuit is flexed repeatedly, such as in a computer disk drive. Copper foil is an integral part of the flexible printed circuit board and it must therefore withstand the bending stress imposed upon it.

Electrodeposited copper foil may be used for flexible circuits. However, conventional electrodeposited copper foil has a fatigue ductility of about 20 to 50 percent. The fatigue ductility may be slightly improved if the electrodeposited copper foil is heat treated. Heat treated electrodeposited copper foil has a fatigue ductility level which is acceptable for single bends and large radius bends.

Conventional electrodeposited copper foil is made using an electrolyte containing about 30 to about 150 ppm free chloride ions. The free chloride ion, the presence of which may be attributable to water contamination or intentional addition, roughens the foil. As a result, the copper foil possesses high bond strength between itself and laminate resins because of the larger grain size and increased surface topography (more dendritic). This is because free chloride ions in the electrolyte contribute to a columnar grain structure in the resultant electrodeposited copper foil. However, copper foil having a columnar grain structure is not conducive to good flex performance because of failure at the large grain boundaries which are vertical relative to the foil plane. Moreover, conventional electrodeposited copper foils are produced using electrolytes containing organic additives such as animal glue. However, the presence of organic additives in the electrolyte results in copper foil which is resistant to metallurgical change upon heating and is weakened at the grain boundaries, which in turn results in a lower fatigue ductility. Accordingly, conventional electrodeposited copper foil and heat treated electrodeposited copper foil are not entirely appropriate for flex circuits.

In the hard-rolled state, wrought copper foil has sufficient strength to make it handleable. Wrought copper foils have a tendency to low temperature anneal. Heating wrought copper foil, for example by laminating copper foil to various polymeric resins, anneals the copper foil thus enhancing its fatigue ductility. Wrought copper foil is amenable to recrystallized grain growth during heat treatment at relatively low temperatures, about 200° C. and less. Accordingly, wrought copper foil is currently preferred for higher performance dynamic flex applications, for instance flex circuits. Similarly, annealed wrought copper foil is also preferred for higher performance dynamic flex applications. Annealed wrought copper foil possesses a larger grain size and grain orientation which lead to better fatigue ductility compared to annealed electrodeposited copper foil. Annealed wrought copper foil has a fatigue ductility greater than the 65%, the minimum required in ANSI/IPC spec MF 150 F for Grade 7 copper foil. Wrought copper foil and annealed wrought copper foil, however, are subject to oxide inclusions which consequently degrade the properties and characteristics of the foil.

Generally speaking, the copper foils described above do not satisfy all the demands of copper foil for use in flex circuits. More specifically, electrodeposited copper foil and heat treated copper foil have low fatigue ductilities. Because of the grain structure and oxide inclusions of wrought copper foil, wrought copper foil has limited flex cycle performance. Furthermore, wrought copper foil exhibits anisotropic flex performance because of directional rolling. Annealed wrought copper foil has low tensile strength which leads to poor handleability. Wrought copper foil and annealed wrought copper foil have lower copper to laminate bond strength because of low surface roughness, limited thinness because of mechanical limitations associated with their manufacture, and limited width because of additional mechanical limitations associated with their manufacture.

U.S. Pat. No. 5,431,803 discloses a controlled low profile electrodeposited copper foil having a substantially uniform randomly oriented grain structure that is essentially columnar grain free and twin boundary free and having an average grain size of up to about 10 microns. The reference indicates that this foil has an ultimate tensile strength measured at 23° C. in the range of about 87,000 to about 120,000 psi and an elongation measured at 180° C. of about 15% to about 28%. The reference also discloses a process for making the foregoing foil, the process comprising: (A) flowing an electrolyte solution between an anode and a cathode and applying an effective amount of voltage across said anode and said cathode to deposit copper on said cathode; said electrolyte solution comprising copper ions, sulfate ions and at least one organic additive or derivative thereof, the chloride ion concentration of said solution being up to about 1 ppm; the current density being in the range of about 0.1 to about 5 A/cm$^2$; and (B) removing copper foil from said cathode.

SUMMARY OF THE INVENTION

This invention relates to an annealable electrodeposited copper foil having a substantially uniform unoriented grain structure that is essentially columnar grain free, said foil being characterized by a fatigue ductility of at least about 25% after being annealed at 177° C. for 15 minutes. In one embodiment, the foil is annealed, said foil being characterized by a fatigue ductility of at least about 65%. The invention also relates to a process for making an electrodeposited copper foil using an electrolyte solution characterized by a critical concentration of chloride ions of up to about 5 ppm and organic additives of up to about 0.2 ppm.

DESCRIPTION OF THE PREFERRED EMBODIMENTS

Figure 1:
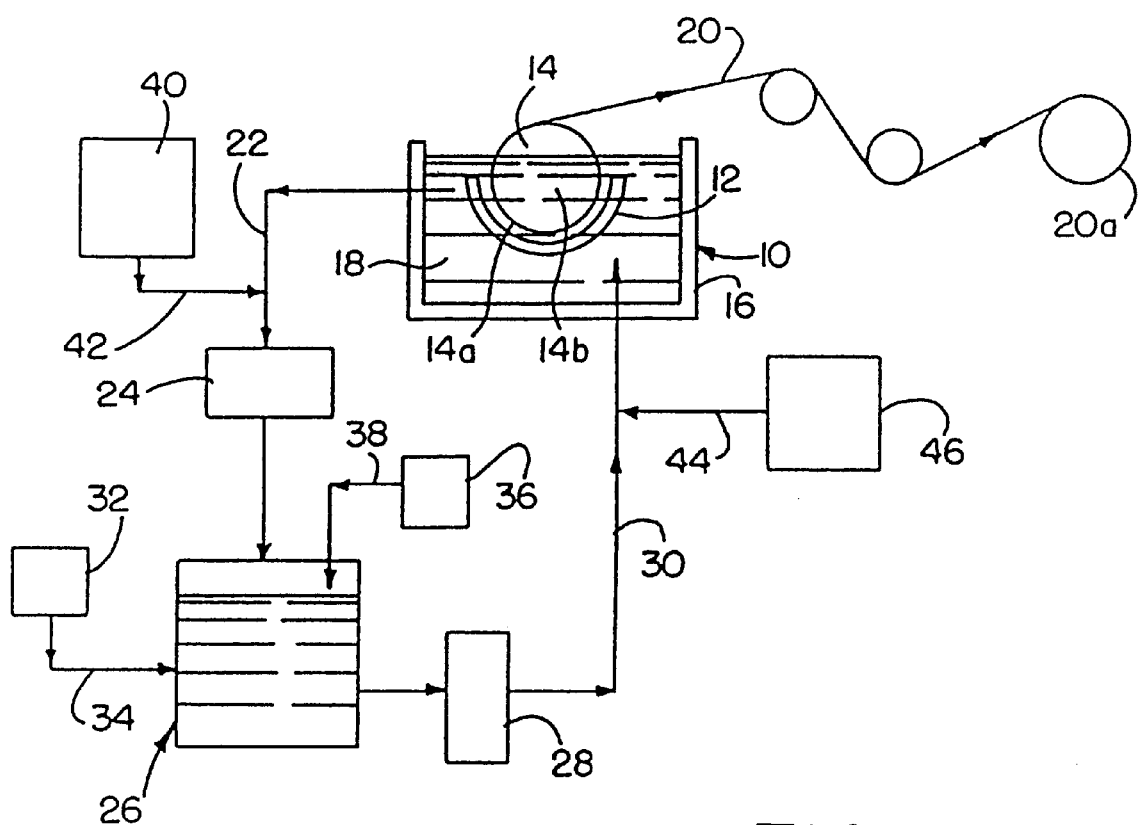
FIG. 1 is a flow sheet illustrating the process of the invention in one embodiment.

The inventive copper foils are high fatigue ductility electrodeposited copper foils that exhibit a unique and novel combination of characteristics. In one embodiment, the inventive foils are low temperature annealable foils that have a substantially uniform unoriented grain structure that is essentially columnar grain free, said foils being characterized by a fatigue ductility of at least about 25% after being annealed at 177° C. for 15 minutes. In one embodiment, the inventive copper foils are annealed foils characterized by a fatigue ductility of at least about 65%.

The procedure for measuring fatigue ductility is given in Test Method 2.4.2.1 of IPC-TM-650. Fatigue ductility is calculated using the following equation.

$$N_f^{-0.6} D_f^{0.75} + 0.9 \frac{S_u}{E} \left[ \frac{\exp(D_f)}{0.36} \right]^{\left(0.1785 \log \frac{10^5}{N_f}\right)} - \frac{2t_M}{2\rho + t} = 0 \quad (I)$$

In equation (I), $D_f$ is fatigue ductility (inch/inch (×100.0%)), $N_f$ is cycles-to-failure, $S_u$ is ultimate tensile strength (psi), E is modulus of elasticity (psi), $t_M$ is core thickness (inch), t is specimen micrometer thickness (inch), p is mandrel radius of curvature (inch) within 0.005 mm [0.0002 inch].

In one embodiment the inventive foils have high ultimate tensile strengths (UTS) for ease of handling and surface quality control, and high elongations at elevated temperatures for reduced cracking. In one embodiment, the inventive foils have controlled low profiles to provide enhanced etchability and impedance control. In one embodiment, the inventive foils are free of oxide inclusions.

The inventive foils are achieved by virtue of the inventive process for making the foil which involves electrodeposition using electrolyte solutions employing critical concentrations of chloride ions at levels of about 5 ppm or less and preferably zero, and organic additives (e.g., animal glue) of about 0.2 ppm or less and preferably zero.

In one embodiment the inventive copper foils are characterized by a substantially uniform unoriented grain structure that is essentially columnar grain free. In one embodiment, these foils are essentially twin boundary free. In one embodiment, the inventive foils are substantially porosity free. The expressions "essentially columnar grain free", "essentially twin boundary free", and "substantially porosity free" refer to the fact that in most instances microscopic or transmission electron microscopy (TEM) analysis of the inventive foils demonstrates that such foils are columnar grain free, twin boundary free or porosity free, but that on occasions minor amounts of columnar grain formation, twin boundary formation and/or porosity may be observed.

In one embodiment, the inventive foils as produced, prior to any annealing or heat treating, have an average grain size in the range of up to about 3 microns, and in one embodiment in the range of about 0.5 to about 3 microns, and in one embodiment about 1 to about 2 microns. In one embodiment, the inventive foils are heat treated at 177° C. for 15, and these foils have an average grain size of up to about 5 microns, and in one embodiment about 1 to about 5 microns, and in one embodiment about 2 to about 4 microns. In one embodiment, the inventive foils are heat treated at a temperature in excess of about 200° C. for at least about 30 minutes and these foils have an average grain size of up to about 8 microns, and in one embodiment about 3 to about 8 microns, and in one embodiment about 4 to about 7 microns.

In one embodiment, the inventive foils as produced, prior to any annealing or heat treating, have a UTS at 23° C. in the transverse direction in the range of about 60,000 psi to about 95,000 psi, and in one embodiment about 60,000 psi to about 85,000 psi, and in one embodiment about 65,000 psi to about 75,000 psi, using Test Method 2.4.18 of IPC-TM-650. In one embodiment, the UTS for these foils at 180° C. in the transverse direction is in range of about 22,000 psi to about 32,000 psi, and in one embodiment about 23,000 psi to about 30,000 psi, and in one embodiment about 25,000 to about 28,000 psi using the foregoing test method. In one embodiment, the elongations for these foils at 23° C. in the transverse direction are about 8% to about 18%, and in one embodiment about 9% to about 16%, and in one embodiment about 9% to about 14% using the foregoing test method. In one embodiment, the elongations for these foils at 180° C. in the transverse direction are about 24% to about 45%, and in one embodiment about 27% to about 41%, and in one embodiment about 29% to about 38%, using the foregoing test method.

In one embodiment, the inventive foils are heat treated or annealed at 177° C. for 15 minutes, and the UTS for these foils at 23° C. in the transverse direction is in the range of about 42,000 psi to about 70,000 psi, and in one embodiment about 44,000 psi to about 65,000 psi, and in one embodiment about 46,000 psi to about 60,000 psi, using Test Method 2.4.18 of IPC-TM-650. In one embodiment, the UTS for these foils at 180° C. in the transverse direction is in range of about 22,000 psi to about 32,000 psi, and in one embodiment about 23,000 psi to about 30,000 psi, and in one embodiment about 25,000 to about 28,000 psi using the foregoing test method. In one embodiment, the elongations for these foils at 23° C. in the transverse direction are about 15% to about 31%, and in one embodiment about 17% to about 27%, and in one embodiment about 19% to about 23% using the foregoing test method. In one embodiment, the elongations for these foils at 180° C. in the transverse direction are about 24% to about 45%, and in one embodiment about 27% to about 40%, and in one embodiment about 29% to about 37%, using the foregoing test method.

In one embodiment, the inventive foils are heat treated or annealed at temperatures in excess of about 200° C. for time periods of about 30 minutes or more and the UTS for these foils when tested at 23° C. in the transverse direction is in the range of about 36,000 psi to about 48,000 psi, and in one embodiment about 38,000 psi to about 46,000 psi, and in one embodiment about 40,000 psi to about 45,000 psi, using Test Method 2.4.18 of IPC-TM-650. In one embodiment, the UTS for these foils when tested at 180° C. in the transverse direction is in range of about 22,000 psi to about 32,000 psi, and in one embodiment about 23,000 psi to about 30,000 psi, and in one embodiment about 25,000 to about 28,000 psi using the foregoing test method. In one embodiment, the elongations for these foils when tested at 23° C. in the transverse direction are about 23% to about 36%, and in one embodiment about 25% to about 34%, and in one embodiment about 27% to about 32% using the foregoing test method. In one embodiment, the elongations for these foils when tested at 180° C. in the transverse direction are about 25% to about 48%, and in one embodiment about 27% to about 42%, and in one embodiment about 29% to about 38%, using the foregoing test method.

In one embodiment, the inventive foils as produced, prior to any annealing or heat treating, have a fatigue ductility in the transverse direction in the range of about 15% to about 60%, and in one embodiment about 15% to about 55%, and in one embodiment about 20% to about 50%, using Test Method 2.4.2.1 of IPC-TM-650. In one embodiment, the inventive foils are heat treated at 177° C. for 15 minutes and the fatigue ductility for these foils in the transverse direction is at least about 25%, and in one embodiment in the range of about 45% to about 90%, and in one embodiment about 55% to about 80%, and in one embodiment about 65% to about 75%. In one embodiment, the inventive foils are heat treated at a temperature in excess of about 200° C. for at least about 30 minutes and the fatigue ductility for these foils in the transverse direction is at least about 65%, and in one embodiment in the range of about 65% to about 120%, and in one embodiment about 65% to about 110%, and in one embodiment about 65% to about 100%.

In one embodiment, the inventive foils as produced, prior to any annealing or heat treating, endure about 150 to about 270 flex cycles prior to breaking using a 2 mm mandrel in the transverse direction with an 84 gram load attached to the foil, and in one embodiment about 170 to about 270 flex cycles, and in one embodiment about 190 to about 250 flex cycles prior to breaking. In one embodiment, the inventive foils are heat treated at 177° C. for 15 minutes and these foils endure about 220 to about 360 flex cycles prior to breaking, and in one embodiment about 240 to about 340 flex cycles, and in one embodiment about 260 to about 320 flex cycles prior to breaking. In one embodiment, the inventive foils are heat treated at a temperature in excess of about 200° C. for at least about 30 minutes and these foils endure about 260 to about 500 flex cycles prior to breaking, and in one embodiment about 300 to about 440 flex cycles, and in one embodiment about 340 to about 400 flex cycles prior to breaking.

The inventive copper foils generally have a matte-side raw foil roughness, $R_{tm}$, of about 1 to about 10 microns, and in one embodiment about 2 to about 8 microns, and one embodiment about 3 to about 6 microns. $R_{tm}$ is the mean of the maximum peak-to-valley vertical extent from each of five consecutive sampling lengths, and can be measured using a Surftronic 3 profilometer marketed by Rank Taylor Hobson, Ltd., Leicester, England. The $R_{tm}$ for the shiny side of these foils is generally less than about 6 microns, and in one embodiment less than about 5 microns, and in one embodiment in the range of about 2 to about 6 microns, in the range of about 2 to about 5 microns.

The weights for these copper foils generally range from about ⅛ to about 14 ounces per square foot, and in one embodiment about ¼ to about 6 ounces per square foot, and in one embodiment about ⅜ to about 6 ounces per square foot, and in one embodiment about ½ to about 2 ounces per square foot. In one embodiment, these foils have weights of about ½, 1 or 2 ounces per square foot. A foil having a weight of ½ ounce per square foot has a nominal thickness of about 17 microns. A foil having a weight of 1 ounce per square foot has a nominal thickness of about 35 microns. A foil having a weight of 2 ounces per square foot has a nominal thickness of about 70 microns. In one embodiment, these foils have a thickness in the range of about 10 to about 250 microns. The $R_{tm}$ for the thinner foils tends to be lower than for the thicker foils. Thus, for example, foils having weights of one-half ounce per square foot have, in one embodiment, a matte side raw foil $R_{tm}$ in the range of about 1 to about 4 microns, while foils having weights of 2 ounces per square foot have, in one embodiment, a matte side raw foil $R_{tm}$ in the range of about 5 to about 7 microns.

A number of advantages are realized by various embodiments of the invention. In one embodiment, the inventive foils have a higher fatigue ductility and endure more flex cycles than prior art electrodeposited, stress released electrodeposited, or fully annealed electrodeposited copper foils. The annealed inventive foils, in one embodiment, endure more flex cycles prior to breaking than annealed wrought foils. The low temperature annealable inventive foils, in one embodiment, endure more flex cycles prior to breaking than low temperature annealable wrought foils. The inventive foils, in one embodiment, exhibit higher fatigue ductilities than prior art low temperature annealable copper foils, either wrought or electrodeposited. The inventive foils, in one embodiment, exhibit more isotropic foil properties than wrought annealed foils. The inventive foils, in one embodiment, exhibit higher tensile strengths after annealing than wrought foils. The inventive foils, in one embodiment, exhibit higher copper to resin bond strengths than wrought annealed foils. In one embodiment, it is possible to produce the inventive foils with wider widths than wrought annealed foils, this advantage providing the inventive foils with enhanced economies of scale. With the inventive foils, it is possible to achieve fatigue ductilities in excess of about 65% with lower annealing temperatures than with prior art electrodeposited foils. The inventive foils, in one embodiment, are less costly to produce than wrought foils in thin gauges.

The inventive process involves forming an electrolyte solution, flowing it between the anode and cathode of an electroforming cell, and depositing copper on the cathode. The electrolyte solution is formed by dissolving a copper feed stock, which can be copper shot, copper wire or recycled copper, in a sulfuric acid solution. The copper feedstock, sulfuric acid and water are preferably high purity grade materials. The electrolyte solution can be subjected to a purification or filtering process prior to entering the electroforming cell. When voltage is applied between the anode and cathode, electrodeposition of copper occurs at the cathode. The electric current is preferably direct current or alternating current with a direct current bias. The electrodeposited copper is removed from the cathode as a continuous thin web of foil as the cathode rotates. It can be collected in roll form. The rotating cathode preferably is in the form of a cylindrical mandrel. However, alternatively, the cathode can be in the form of a moving belt. Both of these designs are known in the art. In one embodiment, the cathode is stainless steel or a chromium plated stainless steel drum. In one embodiment, the cathode is made of titanium or a titanium alloy. The anode has a curved shape conforming to the curved shape of the cathode to provide a uniform gap between the anode and the cathode. This gap can be from about 0.2 to about 2 centimeters in length.

The velocity of the flow of the electrolyte solution through the gap between the anode and the cathode is generally in the range of about 0.2 to about 3 meters per second, and in one embodiment about 0.5 to about 2.5 meters per second, and in one embodiment about 0.7 to about 2 meters per second. The electrolyte solution generally has a free sulfuric acid concentration in the range of about 10 to about 150 grams per liter, and in one embodiment about 40 to about 110 grams per liter, and in one embodiment about 50 to about 90 grams per liter. The temperature of the of the electrolyte solution in the electroforming cell is generally in the range of about 40° C. to about 80° C., and in one embodiment about 45° C. to about 75° C., and in one embodiment about 50° C. to about 70° C. The copper ion concentration (contained in $CuSO_4$) is generally in the range of about 50 to about 130 grams per liter, and in one embodiment from about 65 to about 115 grams per liter, and in one embodiment about 80 to about 100 grams per liter. The current density is critical and is in the range of about 500 to about 2000 amps per square foot, and in one embodiment about 500 to about 1700 amps per square foot, and in one embodiment about 600 to about 1400 amps per square foot.

The level of undesirable impurities (other than chloride ions) in the electrolyte solution is generally less than about 10 grams per liter, and in one embodiment in the range of about 0.2 to about 5 grams per liter, and in one embodiment about 0.4 to about 2 grams per liter. These impurities include phosphates, arsenic, zinc, tin, undesirable organic impurities, and the like.

The free chloride ion concentration of the operating electrolyte solution is critical and is preferably zero, but as a practical matter is in the range of up to about 5 ppm, and in one embodiment up to about 3 ppm, and in one embodiment up to about 1 ppm. The chloride ion concentration can be less than about 0.5 ppm, and in one embodiment less than about 0.2 ppm, and in one embodiment less than about 0.1 ppm, and in one embodiment less than about 0.05 ppm. Chloride ions may be added to the electrolyte solution as HCl, NaCl or other free chloride containing species, but the concentration of such chloride ions must be mounted at the foregoing levels. The term "operating electrolyte solution" is used herein to refer to the electrolyte solution after it enters the operating electroforming cell. A method for measuring low concentrations of chloride ion in the electrolyte solution involves the use of nephelometry and a reagent which forms an insoluble precipitate with chloride ions. Using a nephelometer, the chloride ion content of the sample can be quantified at levels as low as 0.01 ppm.

It is critical that the concentration of organic additives in the electrolyte solution be in the range of up to about 0.2 ppm, and in one embodiment up to about 0.1 ppm. In one embodiment, no organic additives are added, and thus the concentration of said organic additives is zero. When organic additives are used, such additives can be one or more gelatins. The gelatins that are useful herein are heterogeneous mixtures of water-soluble proteins derived from collagen. Animal glue is a preferred gelatin. The organic additive can be selected from the group consisting of saccharin, caffeine, molasses, guar gum, gum arabic, thiourea, the polyalkylene glycols (e.g., polyethylene glycol, polypropylene glycol, polyisopropylene glycol, etc.), dithiothreitol, amino acids (e.g., proline, hydroxyproline, cysteine, etc.), acrylamide, sulfopropyl disulfide, tetraethylthiuram disulfide, alkylene oxides (e.g., ethylene oxide, propylene oxide, etc.), the sulfonium alkane sulfonates, thiocarbamoyidisulfide, or derivatives or mixtures of two or more thereof.

In one embodiment of the invention a continuous electrodeposition process for making copper foil is provided. A flow sheet of this process is depicted in FIG. 1. The apparatus used with this process includes an electroforming cell 10 that includes anode 12 cathode 14, vessel 16 and electrolyte solution 18. Anode 12 is submerged in electrolyte solution 18, and cathode 14 is partially submerged in electrolyte solution 18.

Electrical means that are well known in the art are provided for applying a voltage between anode 12 and cathode 14. The current is preferably direct current or alternating current with a direct current bias. Copper ions in solution 18 gain electrons at the peripheral surface 14a of cathode 14 whereby metallic copper plates out in the form of a foil layer 20. Cathode 14 rotates continuously about its axis 14b during the process and foil layer 20 is continuously withdrawn from surface 14a as a continuous web which is formed into a roll 20a.

The process depletes the electrolyte solution of copper ions and organic additives, when such organic additives are used. These ingredients are continuously replenished. Electrolyte solution 18 is withdrawn through line 22 and recirculated through filter 24, digester 26 and filter 28, and then is reintroduced into vessel 16 through line 30. Sulfuric acid from a source 32 is advanced to digester 26 through line 34. Copper from a source 36 is introduced into digester 26 along path 38. In one embodiment the copper is in the form of copper shot, copper wire, copper oxide or recycled copper. The copper is dissolved by the sulfuric acid and air to form copper ions in digester 26.

Organic additives, when used, are added to the recirculating solution in line 22 from a source 40 through line 42 or through line 44 from a source 46. The addition rate for these organic additives is generally up to about 0.1 mg/min/kA, and in one embodiment up to about 0.07 mg/min/kA.

Additional advantages of the invention include:

(1) Easier bath control: with chloride ion levels up to about 5 ppm, bath control is easier. When chloride ions are present at higher levels, their concentration changes when the copper dissolution rate changes. At such higher levels chloride ions are continuously depleted by drag-out, plate-out, misting, etc., and therefore require constant monitoring and control.

(2) Longer drum and equipment life: chloride ions are known to attack and cause pitting and to accelerate corrosion of most metal surfaces. In the electroforming bath, chloride ions shorten the usable life of a drum surface and gradually corrode tanks, pipes, filters, etc. With the inventive process, drum surface lifetimes are increased.

(3) Carbon filtration reduced: the presence of organic additives such as animal glue in the electrolyte solution necessitates carbon filtration of the electrolyte. With the inventive process, the use of organic additives is minimal or non-existent, and therefore the requirement for carbon filtration is reduced or eliminated.

The inventive foils, as produced in the electroforming cell, are low temperature annealable copper foils. In one embodiment, these foils are heat treated or annealed at a sufficient temperature and for an effective period of time to induce stress relaxation and thereby increase fatigue ductility. The heat treatment temperature is generally in the range of about 120° C. to about 400° C., and in one embodiment about 140° C. to about 300° C., and in one embodiment about 160° C. to about 250° C. The duration of the heat treatment is dependent on the particular method of which the heat treatment is carried out. For example, the heat treatment may be carried out in one or more of the following ways: in an air oven, in an inert atmosphere oven, in a vacuum, by radiation, and/or by direct contact. The heat treatment may alternatively be carried out by resistance heating the foil strip, heating in a lamination press, or by post-baking after lamination. It is critical that the time of the heat treatment is long enough at a particular temperature so that the crystal structure, defects and dislocations of the copper foil complete their transformation. For instance, a large amount of foil in a large batch oven requires a relatively long heat treatment time, mainly to heat up the oven, the inner wraps on the roll, and air trapped between the wraps. A continuous heat treatment process conversely requires a relatively short time since only the copper foil entering the oven is brought up to the particular temperature. Generally, the heat treatment time is between about 0.001 to about 24 hours, and in one embodiment about 0.01 to about 6 hours, and in one embodiment about 0.03 to about 3 hours.

The terms "untreated" and "raw" are used herein to refer to a base foil that has not undergone subsequent treatment for the purpose of refining or enhancing the foil properties. The term "treated" is used herein to refer to raw or base foil that has undergone such treatment. This treatment is entirely conventional and typically involves the use of various treating and rinsing solutions. In one embodiment, the raw or base foil has at least one roughened layer of copper or copper oxide applied to one or both sides of the foil In one embodiment, the raw or base foil has at least one metallic or barrier layer applied to one or both sides of the foil. The metal in this metallic 5 layer is selected from the group consisting of indium, zinc, tin, nickel, cobalt, copper-zinc mixture or alloy, zinc-nickel mixture or alloy, copper-tin mixture or alloy and combinations thereof. These metallic layers generally have thicknesses in the range of about 0.01 to about 1 micron, and in one embodiment about 0.05 to about 0.1 micron.

In one embodiment, the raw or base foil has at least one metallic or stabilization layer applied to one or both sides of the foil. The metal in this metallic layer is selected from the group consisting of tin, chromium, chromiumzinc mixture or alloy, zinc-nickel mixture or alloy and combinations thereof. These metallic layers generally have thicknesses in the range of about 0.005 to about 0.05 micron, and in one embodiment about 0.01 to about 0.02 micron.

In one embodiment, the raw or base foil has at least one first metallic or barrier layer applied to one or both sides of the foil, the metal in the first metallic layer being selected from the group consisting of indium, zinc, tin, nickel, cobalt, copper-zinc mixture or alloy and copper-tin mixture or alloy, and at least one second metallic or stabilization layer applied to the first metallic layer, the metal in the second metallic layer being selected from the group consisting of tin, chromium, and chromium-zinc mixture or alloy.

In one embodiment, the raw or base foil has at least one roughened layer of copper or copper oxide applied to one or both sides of the foil, at least one first metallic or barrier layer applied to the roughened layer, the metal in the first metallic layer being selected from the group consisting of indium, zinc, tin, nickel, cobalt, copper-zinc mixture or alloy and copper-tin mixture or alloy, and at least one second metallic or stabilization layer applied to the first metallic layer, the metal in the second metallic layer being selected from the group consisting of tin, chromium, and chromium-zinc mixture or alloy. In one embodiment, the foregoing combination of metallic layers is applied to one side of the foil (e.g., matte side), and the above-mentioned second metallic or stabilization layer is applied to the base foil on the other side (e.g., shiny side) of the foil.

A silane coupling agent can be applied over the one or both sides of the inventive foil or one of the above-mentioned metallic treatment layers. The silane coupling agent can be represented by the formula

wherein R is a functionally substituted hydrocarbon group, the functional substituent of said functionally substituted hydrocarbon group being amino, hydroxy, halo, mercapto, alkoxy, acyl, or epoxy; X is a hydrolyzable group, such as alkoxy (e.g., methoxy, ethoxy, etc.), or halogen (e.g., chlorine); and n is 1, 2 or 3, and preferably n is 3. The silane coupling agents represented by the above formula include halosilanes, aminoalkoxysilanes, aminophenylsilanes, phenylsilanes, heterocyclic silanes, N-heterocyclic silanes, acrylic silanes, mercapto silanes, and mixture of two or more thereof.

Useful silane coupling agents include those selected from the group consisting of aminopropyltrimethoxy silane, tetramethoxy silane, tetraethoxy silane, bis(2-hydroxyethyl)-3-aminopropyltriethoxy silane, 3-(N-styrylmethyl-2-aminoethylamine) propyltrimethoxy silane, 3-glycidoxypropyltrimethoxy silane, N-methylaminopropyltrimethoxy silane, 2-(2-aminoethyl-3-aminopropyl)trimethoxy silane, and N-phenylaminopropyltrimethoxy silane.

A useful silane coupling agent mixture is 3-glycidoxypropyltrimethoxy silane, and tetramethoxy silane or tetraethoxy silane. The weight ratio of the former to the latter can range from about 1:10 to about 10:1, and in one embodiment about 1:5 to about 5:1, and in one embodiment the weight ratio is about 4:1.

A useful silane coupling agent mixture is N-methylaminopropyltrimethoxy silane and chloropropyltrimethoxy silane. The weight ratio of the former to the latter can range from about 1:10 to about 10:1, and in one embodiment about 1:5 to about 5:1, and in one embodiment the weight ratio is about 1:1.

A useful silane coupling agent mixture is 3-(N-styrylmethyl-2-aminoethyl amino)propyltrimethoxy silane and N-methylaminopropyltrimethoxy silane. The weight ratio of the former to the latter can range from about 1:10 to about 10:1, and in one embodiment about 1:5 to about 5:1, and in one embodiment the weight ratio is about 1:1.

A useful silane coupling agent mixture is 3-glycidoxypropyltrimethoxy silane and N-methylaminopropyltrimethoxy silane. The weight ratio of the former to the latter can range from about 1:10 to about 10:1, and in one embodiment about 1:5 to about 5:1, and in one embodiment the weight ratio is about 1:3.

The coating of the foil surface with the silane coupling agent may be effected by applying the silane coupling agent alone to the surface of the foil. However, it is generally preferred that coating be effected by applying the silane coupling agent in a suitable medium to the foil surface. More specifically, the silane coupling agent can be applied to the foil surface in the form of a solution in water, a mixture of water and alcohol, or a suitable organic solvent, or as an aqueous emulsion of the silane coupling agent, or as an aqueous emulsion of a solution of the silane coupling agent in a suitable organic solvent. Conventional organic solvents may be used for the silane coupling agent and include, for example, alcohols, ethers, ketones, and mixtures of these with aliphatic or aromatic hydrocarbons or with amides such as N,N-dimethylform-amide. Useful solvents are those having good wetting and drying properties and include, for example, water, ethanol, isopropanol, and methylethylketone. Aqueous emulsions of the silane coupling agent may be formed in conventional manner using conventional dispersants and surfactants, including non-ionic dispersants. It may be convenient to contact the metal surface with an aqueous emulsion of the silane coupling agent. The concentration of the silane coupling agent in such solutions or emulsions can be up to about 100% by weight of the silane coupling agent, and in one embodiment is in the range of about 0.1% to about 5% by weight, and in one embodiment about 0.3% to about 1% by weight. The process of coating with the silane coupling agent may be repeated, if desired, several times. The silane coupling agent may be applied to the foil surface using known application methods which include reverse roller coating, doctor blade coating, dipping, painting and spraying.

The application of the silane coupling agent to the foil surface is typically effected at a temperature of about 15° C. to about 45° C., and in one embodiment about 20° C. to about 30° C. Following application of the silane coupling agent to the foil surface, the silane coupling agent can be heated to a temperature of about 60° C. to about 170° C., and in one embodiment about 90° C. to 150° C., for generally about 0.1 to about 5 minutes, and in one embodiment about 0.2 to about 2 minutes to enhance drying of the surface. The dry film thickness of the silane coupling agent on the foil is generally from about 0.002 to about 0.1 micron, and in one embodiment about 0.005 to about 0.02 microns.

The inventive copper foils can be bonded to dielectric substrates to provide dimensional and structural stability thereto. In one embodiment, the substrate is a flexible dielectric substrate. Useful dielectric substrates may be prepared by impregnating woven glass reinforcement materials with partially cured resins, usually epoxy resins (e.g., difunctional, tetrafunctional and multifunctional epoxies). Useful resins include amino type resins produced from the reaction of formaldehyde and urea or formaldehyde and melamine, acrylics, polyesters, phenolics, silicones, polyamides, polyimides, di-allyl phthlates, phenylsilanes, polybenizimidazoles, diphenyloxides, polytetrafluoroethylenes, cyanate esters, and the like. These dielectric substrates are sometimes referred to as prepregs.

In preparing the laminates, it is useful for both the prepreg material and the copper foil to be provided in the form of long webs of material rolled up in rolls. In one embodiment these long webs of foil and prepreg are laminated using a continuous process. In this process a continuous web of the foil is brought into contact with a continuous web of prepreg material under laminating conditions to form a laminate structure. This laminate structure is can be cut into rectangular sheets and the rectangular sheets are laid-up or assembled in stacks of assemblages or further processed in roll form.

In one embodiment, the long webs of foil and prepreg material are first cut into rectangular sheets and then subjected to lamination. In this process rectangular sheets of the foil and rectangular sheets of the prepreg material are laid-up or assembled in stacks of assemblages.

Each assemblage may comprise a prepreg sheet with a sheet of foil on either side thereof. The assemblage may be subjected to conventional laminating temperatures and pressures between the plates of laminating presses to prepare laminates comprising sandwiches of a sheet of prepreg between sheets of copper foil.

The prepregs may consist of a woven glass reinforcement fabric impregnated with a partially cured two-stage resin. By application of heat and pressure, the copper foil is pressed tightly against the prepreg and the temperature to which the assemblage is subjected activates the resin to cause curing, that is crosslinking of the resin and thus tight bonding of the foil to the prepreg dielectric substrate. Generally speaking, the laminating operation will involve pressures in the range of from about 250 to about 750 psi, temperature in the range of from about 160° C. to 235° C. and a laminating cycle of from about 15 minutes to about 2 hours. The finished laminate may then be utilized to prepare printed circuit boards (PCB).

In one embodiment, the laminate is subjected to a subtractive copper etching process to form electrically conductive lines or an electrically conductive pattern as part of a process for making a multilayered circuit board. A second prepreg is then adhered to the etched pattern. Techniques for making multilayered circuit boards are well known in the art. Similarly, subtractive etching processes are well known, an example of which is disclosed in U.S. Pat. No. 5,017,271, which is incorporated herein by reference.

A number of manufacturing methods are available for preparing PCBs from laminates. Additionally, there is a myriad of possible end use applications including radios, televisions, computers, etc., for the PCB's. These methods and end uses are known in the art.

The following examples are provided for purposes of illustrating the invention. Unless otherwise indicated, in the following examples as well as throughout the specification and claims, all parts and percentages are by weight, all temperatures are in degrees Celsius, and all pressures are atmospheric.

EXAMPLE 1

The foil samples identified in the table below are prepared using an electrolyte solution having a copper ion concentration of 105 grams per liter, free sulfuric acid concentration of 80 grams per liter, a chloride ion concentration of <0.1 ppm, an animal glue addition rate of 0.07 mg/lmin/kA, and a current density of 1100 amps per square foot. The samples are heat treated or not heat treated as indicated below. The number of flex cycles are measured using a 2 mm diameter mandrel in the transverse direction with an 84 gram load attached to the foil. The foil samples have a nominal weight of 1 oz/ft². The fatigue ductility is calculated using Equation (I).

| Sample No. | Heat Treatment Temp. (° C.) | Time (hour) | Electrolyte Temperature (° C.) | UTS @ 23° C. (lb/in²) | Flex Cycles (#) | Fatigue Ductility (%) |
| --- | --- | --- | --- | --- | --- | --- |
| 1  | —   | —  | 57 | 81800 | 95  | 21.7 |
| 2  | 160 | 3  | 57 | 39200 | 331 | 80.0 |
| 3  | 170 | 3  | 57 | 38700 | 292 | 73.0 |
| 4  | 180 | 3  | 57 | 38200 | 374 | 88.4 |
| 5  | —   | —  | 60 | 78800 | 123 | 27.3 |
| 6  | 160 | 3  | 60 | 39000 | 410 | 94.1 |
| 7  | 170 | 3  | 60 | 39200 | 394 | 91.2 |
| 8  | 180 | 3  | 60 | 39200 | 353 | 84.0 |
| 9  | 150 | 24 | 60 | 36800 | 326 | 80.5 |
| 10 | 160 | 24 | 60 | 38700 | 378 | 88.7 |
| 11 | 170 | 24 | 60 | 37900 | 359 | 85.9 |

Figure 2:
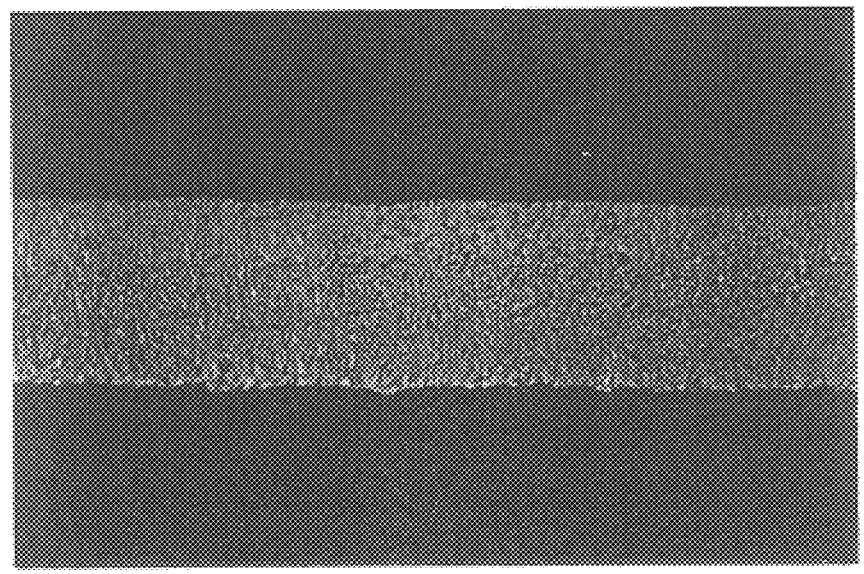
FIG. 2 is a photomicrograph taken at a magnification of 800× of the cross-section of Foil Sample No. 5 from the Example 1.
Figure 3:
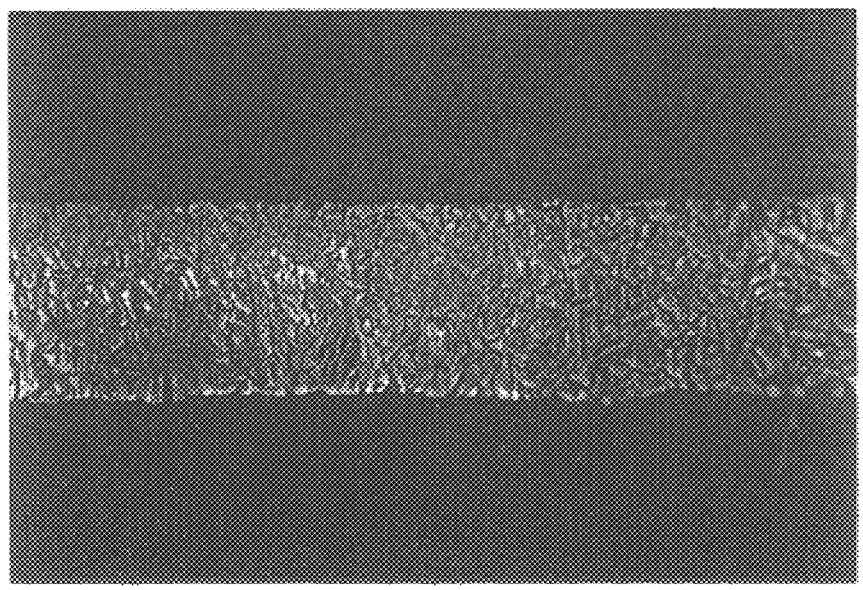
FIG. 3 is a photomicrograph taken at a magnification of 800× of the cross-section of Foil Sample No. 8 from the Example 1.

FIGS. 2 and 3 are photomicrographs taken at a magnification of 800× of cross sections of Samples 5 and 8, respectively. These photomicrographs disclose a substantially uniform unoriented grain structure that is essentially columnar grain free.

EXAMPLE 2

The foil samples identified in the table below are made using an electrolyte solution having a copper ion concentration of 103 grams per liter, a free sulfuric acid concentration of 60 grams per liter, a chloride ion concentration of 2.8 ppm, and an organic additive concentration of zero, i.e., no organic additives are added. The number of flex cycles are determined using a 2 mm diameter mandrel in the transverse direction with an 84 gram load attached to the foil. The foil samples have nominal weights of 1 oz/ft². The tests are conducted in the transverse direction in accordance with IPC MF-150F.

| Sample | Heat Treatment Temp. (° C.) | Time (hour) | Electrolyte Temperature (° C.) | Current Density (Amps/ft²) | UTS @ 23° C. Tensile (lb/in²) | Flex Cycles (#) | Fatigue Ductility (%) |
| --- | --- | --- | --- | --- | --- | --- | --- |
| 1  | —   | —    | 66 | 1090 | 68000 | 206 | 43 |
| 2  | 177 | 0.25 | 66 | 1090 | 51000 | 306 | 66 |
| 3  | 200 | 0.50 | 66 | 1090 | 45000 | 378 | 82 |
| 4  | —   | —    | 60 | 1090 | 75000 | 195 | 40 |
| 5  | 177 | 0.25 | 60 | 1090 | 49000 | 330 | 73 |
| 6  | 200 | 0.50 | 60 | 1090 | 42000 | 306 | 84 |
| 7  | —   | —    | 63 | 1000 | 70000 | 252 | 50 |
| 8  | 177 | 0.25 | 63 | 1000 | 51000 | 343 | 72 |
| 9  | 200 | 0.50 | 63 | 1000 | 46000 | 390 | 84 |
| 10 | —   | —    | 66 | 909  | 64000 | 228 | 46 |
| 11 | 177 | 0.25 | 66 | 909  | 52000 | 312 | 64 |
| 12 | 200 | 0.50 | 66 | 909  | 45000 | 385 | 79 |
| 13 | —   | —    | 60 | 909  | 72000 | 203 | 41 |

-continued

| Sample | Heat Treatment Temp. (° C.) | Heat Treatment Time (hour) | Electrolyte Temperature (° C.) | Current Density (Amps/ft²) | UTS @ 23° C. Tensile (lb/in²) | Flex Cycles (#) | Fatigue Ductility (%) |
|---|---|---|---|---|---|---|---|
| 14 | 177 | 0.25 | 60 | 909 | 48000 | 297 | 65 |
| 15 | 200 | 0.50 | 60 | 909 | 43000 | 395 | 84 |

EXAMPLE 3

The foil samples identified in the table below have a nominal weight of 1 oz/ft². The annealed sample is heat treated at 200–250° C. for 30 minutes. The low temperature annealable foil sample is heat treated at 177° C. for 15 minutes using the cycle required by IPC MF 150F for Grade 8 copper foil. The samples are tested using the cross machine direction. The number of flex cycles are measured using a 2 mm diameter mandrel in the transverse direction with an 84 gram load attached to the foil.

| Property | Units | Annealed | Low Temp. Annealable |
|---|---|---|---|
| Fatigue Ductility | % | 82 | 65 |
| Ultimate Tensile Strength | | | |
| 23° C. | psi | 42000 | 50000 |
| 180° C. | psi | 27000 | 27000 |
| Elongation | | | |
| 23° C. | % | 28 | 30 |
| 180° C. | % | 34 | 21 |
| Roughness, $R_{tm}$ | μm | 5 | 5 |
| Flex Cycles | # | 340 | 320 |
| Peel Strength | lb/in | 8 | 8 |

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A heat treated electrodeposited copper foil having a substantially uniform unoriented grain structure that is essentially columnar grain free; said foil being electrodeposited using an electrolyte solution containing no organic additives and having a chloride ion concentration of up to about 5 ppm; and said foil being heat treated at a temperature in excess of about 200° C. for at least about 30 minutes and capable of enduring about 260 to about 500 flex cycles prior to breaking.

2. The foil of claim 1 wherein said foil is annealed, said foil being characterized by a fatigue ductility of at least about 65%.

3. The foil of claim 1 wherein said foil has an ultimate tensile strength at 23° C. in the range of about 60,000 to about 95,000 psi prior to being heat treated.

4. The foil of claim 1 wherein said foil has an elongation at 23° C. in the range of about 8% to about 18% prior to being heat treated.

5. The foil of claim 1 wherein said foil has an ultimate tensile at 180° C. in the range of about 22,000 to about 32,000 psi.

6. The foil of claim 1 wherein said foil has an elongation at 180° C. in the range of about 24% to about 45%.

7. The foil of claim 2 wherein said foil has an ultimate tensile strength at 23° C. in the range of about 36,000 to about 48,000 psi.

8. The foil of claim 2 wherein said foil has an elongation at 23° C. in the range of about 23% to about 36%.

9. The foil of claim 2 wherein said foil has an ultimate tensile strength at 180° C. in the range of about 22,000 to about 32,000 psi.

10. The foil of claim 2 wherein said foil has an elongation at 180° C. in the range of about 25% to about 48%.

11. The foil of claim 1 wherein the average grain size for said foil is up to about 3 microns.

12. The foil of claim 1 wherein the average grain size for said foil after being annealed at 177° C. for 15 minutes is up to about 5 microns.

13. The foil of claim 2 wherein the average grain size for said foil is up to about 8 microns.

14. The foil of claim 1 wherein the foil has a matte side raw foil $R_{tm}$ in the range of about 1 to about 10 microns.

15. The foil of claim 1 wherein the foil has a shiny side raw foil $R_{tm}$ of less than about 6 microns.

16. The foil of claim 1 with at least one roughened layer of copper or copper oxide applied to one or both sides of said foil.

17. The foil of claim 1 with at least one metallic layer applied to one or both sides of said foil, the metal in said metallic layer being selected from the group consisting of indium, zinc, tin, nickel, cobalt, copper-zinc mixture or alloy, copper-tin mixture or alloy, and zinc-nickel mixture or alloy.

18. The foil of claim 1 with at least one metallic layer applied to one or both sides of said foil, the metal in said metallic layer being selected from the group consisting of tin, chromium, chromium-zinc mixture or alloy, zinc, and zinc nickel mixture or alloy.

19. The foil of claim 1 with at least one roughened layer of copper or copper oxide applied to one or both sides of said foil, at least one first metallic layer applied to said roughened layer, the metal in said first metallic layer being selected from the group consisting of indium, zinc, tin, nickel, cobalt, copper-zinc mixture or alloy, copper-tin mixture or alloy, and zinc-nickel mixture or alloy, and at least one second metallic layer applied to said first metallic layer, the metal in said second metallic layer being selected from the group consisting of tin, chromium, chromium-zinc mixture or alloy, zinc, and zinc-nickel mixture or alloy.

20. The foil of claim 1 with at least one silane coupling agent overlying one or both sides of said foil.

21. The foil of claim 1 wherein said foil is electrodeposited using an electrolyte solution characterized by a chloride ion concentration of up to about 3 ppm.

22. The foil of claim 1 wherein said foil has an ultimate tensile strength at 23° C. in the range of about 42,000 to about 70,000 psi after being annealed at 177° for 15 minutes and prior to being heat treated.

23. The foil of claim 1 wherein said foil has an elongation at 23° C. in the range of about 15% to about 31% after being annealed at 177° C. for 15 minutes and prior to being heat treated.

24. The foil of claim 1 wherein said foil has an ultimate tensile strength at 180° C. in the range of about 22,000 to about 32,000 psi after being annealed at 177° C. for 15 minutes and prior to being heat treated.

25. The foil of claim 1 wherein said foil has an elongation at 180° C. in the range of about 24% to about 45% after being annealed at 177° C. for 15 minutes and prior to being heat treated.

* * * * *